United States Patent [19]

Lewerenz et al.

[11] 4,396,443
[45] Aug. 2, 1983

[54] REDUCTION OF LEAKAGE CURRENT IN INGAAS DIODES

[75] Inventors: Hans J. Lewerenz, Berlin, Fed. Rep. of Germany; Hans J. Stocker, Summit, N.J.

[73] Assignee: Bell Telephone Laboratories, Incorporated, Murray Hill, N.J.

[21] Appl. No.: 339,871

[22] Filed: Jan. 18, 1982

[51] Int. Cl.$^3$ ............................................. H01L 7/00
[52] U.S. Cl. ...................................... 148/171; 29/572; 29/576 B; 29/576 T; 29/580; 148/172; 148/1.5; 156/662
[58] Field of Search .................. 29/572, 576 B, 576 T, 29/580; 148/171, 172, 1.5; 156/662

[56] References Cited

U.S. PATENT DOCUMENTS

| 3,982,315 | 9/1976 | Kubo | 29/572 |
| 4,213,805 | 7/1980 | Tsukada | 148/171 |
| 4,321,613 | 3/1982 | Hughes et al. | 148/171 X |

OTHER PUBLICATIONS

Nishitani et al., *J. of Electrochem. Soc.*, vol. 126, No. 12, Dec. 1979, pp. 2269–2271.
Takahashi, *Japanese Journal of Applied Physics*, vol. 19, No. 10, Oct. 1980, Tokyo, Japan, pp. 1947–1952.
Diadiuk et al., *IEEE Electron Device Letters*, vol. ED-L-l, No. 9, Sep. 1980, pp. 177 and 178.
Kelly et al., *J. of Electrochem. Soc.*, vol. 125, No. 6, Jun. 1978, pp. 860–865.

*Primary Examiner*—George T. Ozaki
*Attorney, Agent, or Firm*—Michael J. Urbano

[57] ABSTRACT

The reverse leakage current of InGaAs diodes, in particular the dark current of $In_{0.53}Ga_{0.47}As$ photodiodes, is reduced by a treatment in a 1:1:X solution of $H_2O_2:H_2SO_4:H_2O$ where $10 \leq X \leq 100$ approximately.

5 Claims, 3 Drawing Figures

REDUCTION OF LEAKAGE CURRENT IN INGAAS DIODES

BACKGROUND OF THE INVENTION

This invention relates to diodes and, in particular, photodiodes.

In an optical communication system the sensitivity of the optical receiver is limited by the sensitivity of the photodiode used to convert the lightwaves into electrical signals. The sensitivity of the photodiode is, in turn, determined by its dark current; i.e., the reverse bias leakage current with no light incident on the photodiode. Reverse bias is typically used, rather than the photovoltaic mode, in order to increase the speed of response of the photodiode. High response speed is important in detecting high data rate digital signals. To this end, photodiodes may also be configured as mesas to reduce their capacitance.

At shorter optical wavelengths such as 0.8–0.9 $\mu$m, Si photodiodes provide sufficiently low dark currents, but at longer wavelengths such as 1.3–1.5 $\mu$m, Si is transparent. Longer wavelengths are of interest because presently available optical fibers exhibit lowest loss and dispersion in this range.

Accordingly, workers in the art have directed their attention to making photodiodes in other materials systems, most notably group III-V compounds such as InGaAs. However, these materials have lower bandgaps than silicon, a feature which is necessary for the detection of longer wavelengths, but which paradoxically increases dark current. Typically, the dark current is about 10 nA for $In_{0.53}Ga_{0.47}As$ mesa photodiodes of $5 \times 10^{-4}$ cm$^2$ area fabricated by liquid phase epitaxy (LPE) using standard Br-methanol etching techniques to configure the mesa.

SUMMARY OF THE INVENTION

We have found a new surface treatment which reduces the reverse leakage current in InGaAs diodes, in particular the dark current of $In_{0.53}Ga_{0.47}As$ photodiodes, by at least an order of magnitude, to less than 1 nA. The treatment comprises etching in a 1:1:X ($H_2O_2:H_2SO_4:H_2O$) by volume mixture where $10 \leq X \leq 100$ approximately. This treatment produces a protective overlayer which is essentially impervious to etching in HF.

BRIEF DESCRIPTION OF THE DRAWING

Our invention, together with its various features and advantages, can be readily understood from the following more detailed description taken in conjunction with the accompanying drawing, in which.

DETAILED DESCRIPTION

Figure 1:
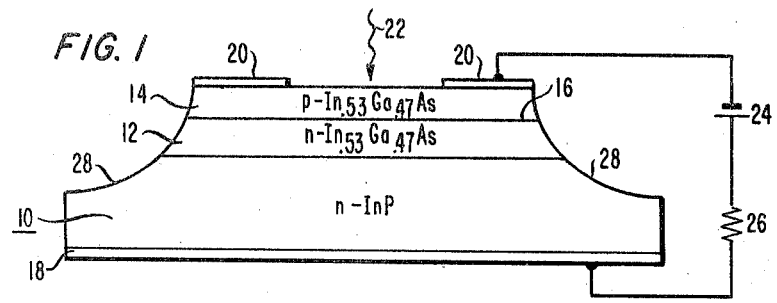
FIG. 1 is a cross-sectional view of an InGaAs photodiode.

With reference now to FIG. 1, a photodiode comprises an n-InP body 10 which may constitute an n-InP substrate or such a substrate with an n-InP buffer layer (not shown) epitaxially grown thereon by techniques well known in the art (e.g., by LPE). Using similar techniques, an $n-In_{0.53}Ga_{0.47}As$ epitaxial layer 12 is grown on body 10 and a $p-In_{0.53}Ga_{0.47}As$ epitaxial layer 14 is grown on layer 12, thereby forming a p-n junction 16 at the interface therebetween. Alternatively, the p-n junction 16 may be formed by well-known diffusion techniques.

Ohmic metal contacts 18 and 20 are formed on the bottom of body 10 and the top of layer 14 by standard techniques, with contact 18 being a broad-area contact and contact 20 being an annular contact to permit optical radiation 22 to be absorbed in layer 14. A reverse bias source 24 and a load 26 are connected across contacts 18 and 20. As is well known, the absorption of photons from radiation 22 generates hole-electron pairs which are separated by the electric field produced by source 24. The flow of holes and electrons to the contacts generates a photocurrent which does work in load 26.

In order to reduce its capacitance, the photodiode has a mesa shape with side walls 28 which extend through both InGaAs layers 12 and 14 into body 10. The mesa shape may be produced by standard Br-methanol etching. In accordance with one aspect of our invention, however, the dark current of the photodiode of FIG. 1 is reduced by subjecting it to a mixture of 1:1:X ($H_2O_2:H_2SO_4:H_2O$) for a few seconds (e.g., 20–45 seconds is suitable but not critical), where $10 \leq X \leq 100$ approximately. Preferably, this step is followed by a rinse in deionized water and drying in a stream of either oxygen, air, or nitrogen.

Figure 2:
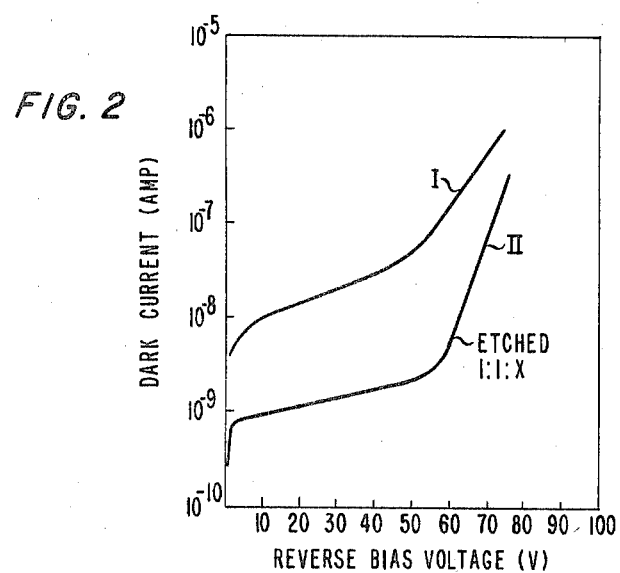
FIG. 2 shows the current-voltage characteristics of an $In_{0.53}Ga_{0.47}As$ mesa photodiode at T=295° K. after standard mesa-etching with Br-methanol (curve I) and after a 20 second etch in 1:1:50 ($H_2O_2:H_2SO_4:H_2O$)

This treatment has been applied to a number of mesa photodiodes which were already bonded to heat sinks and to mesa photodiodes on a wafer prior to dicing into chips. FIG. 2 illustrates the dramatic reduction of the dark current obtained by etching $In_{0.53}Ga_{0.47}As$ mesa diodes with 1:1:X solutions of $H_2O_2:H_2SO_4:H_2O$ where $10 \leq X \leq 100$ approximately. The dark current of the diode at $-10$ V, as shown by curve I, was about 10 after standard Br-methanol etching and subsequent cleaning procedures. After a 1:1:X treatment in accordance with out invention, the dark current was reduced to 1 nA as shown by curve II. Because the capacitance changes only from 0.39 to 0.37 pf, we conclude that the mesa area has been reduced by at most 6% by the re-etching procedure, which is consistent with direct visual inspection and also with the 1:1:X etch rate ($\sim$2200 Å/min. for X=50 and $\sim$13,000 Å/min. for X=10).

Figure 3:
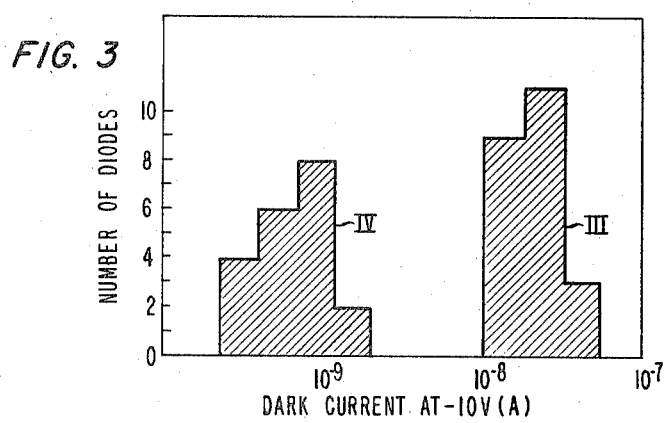
FIG. 3 is a histogram of the dark current of twenty-three $In_{0.53}Ga_{0.47}As$ photodiodes on a single wafer following standard Br-methanol etching and after subsequent 20 second etching in 1:1:10 ($H_2O_2:H_2SO_4:H_2O$).

The effectiveness of the 1:1:X etch in reducing dark current has been demonstrated with data taken on several hundred diodes. An example of the statistical improvement is shown in FIG. 3, which presents a histogram of the dark currents of all the mesa diodes on a typical wafer before (curve III) and after (curve IV) a 20 second etch in a solution of 1:1:10 ($H_2O_2:H_2SO_4:H_2O$) followed by rinsing in deionized water and drying in a nitrogen stream. It can be seen that the dark current decreases by roughly an order of magnitude. Again the capacitance tested before and after showed a change of less than 4%. Similar results were obtained for $10 \leq X \leq 100$.

The effect of these etches on large area ($3 \times 3$ mm$^2$) $<100>$ surfaces of $In_{0.53}Ga_{0.47}As$ grown by LPE on InP substrates was studied with an automatic spectroscopic ellipsometer. The spectral analysis of the overlying films produced by the etching process is based on the dielectric function $\epsilon = \epsilon_1 + i\epsilon_2$ of the substrate material. When $\epsilon_2$ was plotted versus $\epsilon_1$, two characteristic and mutually exclusive branches result: (1) an oxide branch which is the usual trajectory observed for $<\epsilon>$ for semiconductors covered with organic contamination or with a native oxide produced either by chemical means or exposure to air; and (2) a 1:1:X branch which was produced by $H_2O_2:H_2SO_4:H_2O$ in accordance with our invention.

We found that a 1% bromine methanol etch moved the dielectric function to a lower point on the oxide branch. When dilute HF or a 5% HF-methanol mixture was applied to the sample showing a low value of the dielectric function along the oxide branch, a jump in value toward that of the clean surface was observed. The chemical interpretation is, of course, that the HF treatment removes the oxide.

A 1:1:X ($H_2O_2:H_2SO_4:H_2O$) etch, where $10 \leq X \leq 100$, produced a qualitatively different branch of nearly vertical slope. In contrast to the behavior on the oxide branch, the same HF treatment produced no measurable change in the dielectric function. If the surface is oxidized, for instance by $H_2O_2$, then the dielectric function moves toward the oxide branch. If HF is now applied, the dielectric function returns to the clean value.

We therefore have a strong indication that the 1:1:X etch produces a surface overlayer chemically different from that of an oxide. Confirming evidence of a chemical nature or of other types of measurements is necessary before a definite conclusion about the physical and chemical structure of the 1:1:X etched surface can be made. However, the fact that the 1:1:X etched surface is impervious to HF is at least consistent with the model of an In-rich surface.

We speculate that the beneficial effects of the 1:1:X etch, as far as diode leakage currents are concerned, are due to a higher resistance to oxidation in the atmosphere. Since the 1:1:X etch leaves a protective overlayer, it may be expected to be less sensitive to oxidation by the ambient. In contrast, the result of any bromine-methanol etching in the laboratory is to produce an overlayer that is no more than $\sim 2$ Å thick and therefore offers little protection against ambient attack.

It is to be understood that the above-described arrangements are merely illustrative of the many possible specific embodiments which can be devised to represent application of the principles of our invention. Numerous and varied other arrangements can be devised in accordance with these principles by those skilled in the art without departing from the spirit and scope of the invention. In particular, because the etch rate of 1:1:X ($H_2O_2:H_2SO_4:H_2O$) is relatively fast for $X \leq 30$, it can be used as a mesa etch for InGaAs diodes, thereby eliminating the need for Br-methanol or other standard etches in this process step. In this case, the 1:1:X is a selective stop etch which etches InGaAs but no InP.

Moreover, although the foregoing description was in terms of mesa diode examples, our invention is also applicable to planar InGaAs diodes.

What is claimed is:

1. A method of reducing the leakage current of an InGaAs diode by subjecting said diode to a 1:1:X solution of $H_2O_2:H_2SO_4:H_2O$, where $10 \leq X \leq 100$ approximately.

2. A method of reducing the leakage current of an InGaAs diode by subjecting said diode to a 1:1:X solution of $H_2O_2:H_2SO_4:H_2O$ where X is chosen so as to produce an overlayer which is essentially impervious to etching in HF.

3. A method of reducing the dark current of a photodiode comprising the steps of
   providing an InP body,
   epitaxially growing at least one layer of $In_{0.53}Ga_{0.47}As$ on said substrate,
   forming a p-n junction in said at least one layer,
   subjecting said photodiode to a 1:1:X solution of $H_2O_2:H_2SO_4:H_2O$, where $10 \leq X \leq 100$.

4. The method of claim 3 further including between said growing step and said subjecting step the additional step of etching at least said layers to form a mesa.

5. The method of claim 4 wherein said etching step comprises etching with 1:1:X ($H_2O_2:H_2SO_4:H_2O$) where $X \leq 30$.

* * * * *